(12) United States Patent
Moore et al.

(10) Patent No.: US 6,475,284 B1
(45) Date of Patent: Nov. 5, 2002

(54) GAS DISPERSION HEAD

(75) Inventors: Gary M. Moore, Los Gatos, CA (US); Katsuhito Nishikawa, San Jose, CA (US)

(73) Assignee: Moore Epitaxial, Inc., Tracy, CA (US)

( * ) Notice: Subject to any disclaimer, the term of this patent is extended or adjusted under 35 U.S.C. 154(b) by 0 days.

(21) Appl. No.: 09/399,115

(22) Filed: Sep. 20, 1999

(51) Int. Cl.$^7$ .............................................. C23C 16/00
(52) U.S. Cl. ........................................ 118/715; 118/730
(58) Field of Search ................................ 118/715, 725, 118/730

(56) References Cited

U.S. PATENT DOCUMENTS

| | | | | |
|---|---|---|---|---|
| 3,424,629 A | * | 1/1969 | Ernst ............................ | 118/730 |
| 3,603,284 A | * | 9/1971 | Garnache .................... | 118/730 |
| 3,608,519 A | * | 9/1971 | Bean ........................... | 118/730 |
| 3,637,434 A | * | 1/1972 | Nakanuma ................... | 118/730 |
| 3,719,166 A | * | 3/1973 | Gereth ......................... | 118/730 |
| 4,220,116 A | * | 9/1980 | Hochberg .................... | 118/715 |
| 4,716,852 A | * | 1/1988 | Tsujii .......................... | 118/715 |
| 4,745,088 A | * | 5/1988 | Inoue .......................... | 118/730 |
| 4,794,220 A | * | 12/1988 | Sekiya ........................ | 118/730 |
| 4,807,562 A | * | 2/1989 | Sandys ........................ | 118/725 |
| 4,848,272 A | * | 7/1989 | Ohmura ....................... | 118/730 |
| 4,992,301 A | * | 2/1991 | Shishiguchi ................. | 118/730 |
| 5,015,330 A | * | 5/1991 | Okumura ..................... | 118/730 |
| 5,038,711 A | * | 8/1991 | Dan ............................. | 118/730 |
| 5,053,247 A | | 10/1991 | Moore .......................... | 427/55 |
| 5,207,835 A | | 5/1993 | Moore ........................ | 118/725 |
| 5,444,217 A | | 8/1995 | Moore et al. ................ | 219/405 |
| 5,580,388 A | | 12/1996 | Moore ......................... | 118/728 |
| 5,601,107 A | | 2/1997 | Moore et al. ................. | 137/15 |
| 5,683,516 A | * | 11/1997 | DeDontney ................. | 118/718 |
| 5,683,518 A | | 11/1997 | Moore et al. ................ | 118/730 |
| 5,710,407 A | | 1/1998 | Moore et al. ............... | 219/405 |
| 5,746,834 A | | 5/1998 | Hanley ........................ | 118/715 |
| 5,802,099 A | | 9/1998 | Curran et al. ............... | 374/131 |
| 5,820,686 A | | 10/1998 | Moore ......................... | 118/730 |
| 5,843,234 A | | 12/1998 | Finn et al. ................... | 118/715 |
| 5,872,632 A | | 2/1999 | Moore ......................... | 356/381 |
| 5,925,188 A | * | 7/1999 | Oh .............................. | 118/715 |
| 6,024,799 A | * | 2/2000 | Chen .......................... | 118/715 |

FOREIGN PATENT DOCUMENTS

| | | | | |
|---|---|---|---|---|
| JP | 60-250631 | * | 12/1985 | ................ 156/345 |
| JP | 1-134911 | * | 5/1989 | ................ 118/715 |

* cited by examiner

*Primary Examiner*—Richard Bueker
(74) *Attorney, Agent, or Firm*—Gunnison, McKay & Hodgson, L.L.P.; Serge J. Hodgson

(57) ABSTRACT

A semiconductor processing system includes a reactor and a dispersion head within the reactor. During use, process gas is supplied to the dispersion head. The process gas flows through distributors of the dispersion head and into the reactor. The process gas contacts substrates in the reactor thus forming a layer on the substrate. Use of the dispersion head reduces and/or eliminates turbulence and recirculation in the flow of the process gas through the reactor. This results in the formation of layers on the substrates having excellent thickness uniformity. This also allows realization of an abrupt transition between layers formed on the substrates.

41 Claims, 10 Drawing Sheets

GAS DISPERSION HEAD

FIELD OF THE INVENTION

This invention relates generally to semiconductor process equipment, and more particularly, to a method and systems for dispersing gas flow in a semiconductor reactor.

BACKGROUND OF THE INVENTION

Semiconductor processing typically involves the formation of one or more layers on a semiconductor substrate. For example, silicon epitaxy, sometimes called epi, is a process in which one or more layers of single-crystal (monocrystalline) silicon are deposited on a monocrystalline silicon wafer.

FIG. 1 is a schematic representation of a semiconductor processing system 10 in accordance with the prior art. As shown in FIG. 1, system 10 included a susceptor 12 enclosed within a barrel reactor 14. Susceptor 12 was typically suspended from an assembly (not shown), which rotated susceptor 12 during processing. Susceptor 12 supported a plurality of substrates 16, typically monocrystalline silicon wafers.

During processing, substrates 16 were heated with an external radiation source such as tungsten halogen lamps, resistive heating elements and/or RF heaters (not shown). A process gas was introduced into reactor 14 through two injectors 18A, 18B mounted on a gas ring 20. The flow rate of the flow of process gas to injectors 18A, 18B was controlled by a mass flow controller 22 (MFC 22). Injectors 18A, 18B were coupled in parallel to MFC 22. The process gas reacted with heated substrates 16 resulting in the deposition of layers on substrates 16 as those skilled in the art understand. The spent process gas was then exhausted to exhaust 23.

As the art moves towards reduced feature size integrated circuits, it has become increasingly importance that the deposited layers on substrates have uniform thickness. One primary parameter which affects the thickness uniformity is the flow characteristics of the process gas into and through the reactor.

Referring again to FIG. 1, these flow characteristics were controlled to a large extent by injectors 18A, 18B through which the process gas was introduced in reactor 14. More particularly, injectors 18A, 18B aimed the jets of process gas so that the jets collided with each other at a point between susceptor 12 and reactor 14. The goal in aiming the jets was to eliminate any circumferential velocity components of the jets. The mixed jets flowed generally downwards over substrates 16 to the bottom of reactor 14 and to exhaust 23.

To obtained the desired thickness uniformity, injectors 18A, 18B were calibrated. Calibration was typically an iterative process in which a first layer was deposited on a first test substrate, the thickness uniformity of the first layer was measured, and injectors 18A, 18B were adjusted in an attempt to improve the thickness uniformity. A second layer was then deposited on a second test substrate, the thickness uniformity of the second layer was measured, and injectors 18A, 18B were again adjusted. This trial and error procedure was repeated until the desired thickness uniformity was obtained. Unavoidably, the iterative process used to calibrate injectors 18A, 18B was time consuming, labor intensive and generally unpredictable.

In addition to obtaining the desired thickness uniformity, it is also important to have abrupt transitions between layers.

FIG. 2 is a graph of dopant concentration versus depth in a substrate 16 in accordance with the prior art. Referring to FIG. 2, formed on substrate 16 was a heavily doped layer L1 (hereinafter referred to as HD layer L1), a transition layer TL on top of HD layer L1, and a lightly doped layer L2 (hereinafter referred to as LD layer L2) on top of transition layer TL.

By way of example, HD layer L1 was a heavily doped P type silicon layer formed by supplying a process gas having a high P type dopant concentration. Conversely, LD layer L2 was lightly doped P type silicon layer formed by supplying a process gas having a low P type dopant concentration. Transition layer TL was formed as a result of the change from high to low of the P type dopant concentration of the process gas. As shown in FIG. 2, the dopant concentration of transition layer TL gradually changed from heavily doped HD at the bottom of transition layer TL to lightly doped LD at the top of transition layer TL.

As the art moves towards smaller high speed devices, it is important that the transition between layers be abrupt. In particular, referring to FIG. 2, it is important to reduce or eliminate transition layer TL between the top of HD layer L1 and the bottom of LD layer L2. However, use of system 10 (FIG. 1) inherently resulted in the formation of transition layer TL. This limitation of system 10 essentially eliminates the possibility of the use of barrel reactors for the next generation of integrated circuits. Yet, barrel reactors are relatively simple, reliable and cost effective to operate. Accordingly, the art needs a method and apparatus which allows realization of abrupt transitions between layers formed in a barrel reactor.

SUMMARY OF THE INVENTION

In accordance with the present invention, a semiconductor processing system includes a barrel reactor and a dispersion head within the barrel reactor. The dispersion head includes at least one distributor. During use, process gas is supplied to the dispersion head. The dispersion head is hollow (has an internal channel) so that the process gas flows through the channel of the dispersion head to the at least one distributor. The process gas flows through the at least one distributor and into the reactor. The process gas contacts substrates within the reactor thus forming a layer on the substrates. The spent process gas is then exhausted from the reactor.

Of importance, the process gas is dispersed by the dispersion head as the process gas enters the reactor. By dispersing the process gas, and supplying the dispersed process gas to the reactor, the flow characteristics of the process gas through the reactor is improved by reducing turbulence compared to the prior art. More particularly, use of the dispersion head reduces and/or eliminates turbulence and recirculation in the flow of the process gas through the reactor. Thus, the process gas travels through the reactor from the dispersion head to the exhaust in a uniform flow, i.e., in a curtain-like flow, without the turbulence and recirculation of the prior art.

Since the process gas flow is uniform through the reactor, the process gas uniformly contacts the substrates. Accordingly, use of the dispersion head results in the formation of layers on the substrates having excellent thickness uniformity. Further, since the dispersion head disperses the process gas in a repeatable and predefined manner, calibration of the dispersion head is avoided. This is in contrast to the prior art where the injectors had to be calibrated for each reactor and also had to be recalibrated when process parameters, e.g., the flow rate of flow of process gas, were changed. Thus, use of a dispersion head in accordance with the present invention is less time consuming, is less labor intensive and is more reliable than use of the injectors of the prior art.

In addition, use of the dispersion head allows realization of an abrupt transition between layers formed on the substrates. This is because when the process gas is changed to have a new composition, e.g., from a high dopant concentration process gas to a low dopant concentration process gas, the new process gas travels in a uniform flow through the reactor similar to a curtain falling. As the bottom of this curtain passes the substrates, the process gas contacting the substrates abruptly changes to have the new dopant concentration. Thus, an abrupt transition occurs between the layer formed from the process gas having the original gas composition and the new layer formed from the process gas having the new gas composition. Accordingly, use of the dispersion head enables formation of substrates having abrupt transitions between layers using a relatively simple, reliable and cost effective barrel reactor.

In one embodiment, a system includes a barrel reactor and a plurality of dispersion heads extending into the barrel reactor. Each dispersion head of the plurality of dispersion heads is a different tube of a plurality of tubes. These tubes extend through ports of a seal plate or, alternatively, through ports of an inverted barrel reactor.

Also in accordance with a present invention, a method includes dispersing a process gas and supplying the dispersed process gas to a barrel reactor. The process gas travels through the barrel reactor in a uniform flow. This results in the formation of layers on substrates in the reactor having excellent thickness uniformity. This also results in abrupt transitions between layers formed on the substrates.

In one embodiment, a method includes placing a substrate in a reactor. The method further includes supplying a flow of a carrier gas to a dispersion head within the reactor and supplying a flow of a first process gas through injectors to the reactor. The first process gas contacts the substrate thus forming a layer on the substrate. Upon shutting off the flow of the first process gas, the carrier gas uniformly displaces the first process gas thus abruptly terminating the formation of the layer on the substrate.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with the present invention, a semiconductor processing system (FIG. 3) includes a barrel reactor 314 and a dispersion head 330 within reactor 314. During use, process gas is supplied to dispersion head 330. The process gas flows through distributors 332A–332E of dispersion head 330 and into reactor 314. The process gas contacts substrates 316 in reactor 314 thus forming a layer on substrates 316. The spent process gas is then exhausted to exhaust 323.

Of importance, use of dispersion head 330 reduces and/or eliminates turbulence and recirculation in the flow of the process gas through reactor 314. Thus, the process gas travels through reactor 314 in a uniform flow, i.e., in a curtain-like flow, as indicated by the lines 336. This results in the formation of layers on substrates having excellent thickness uniformity.

In addition, use of dispersion head 330 allows realization of an abrupt transition between layers formed on substrates 316. This is because when the process gas is changed to have a new composition, e.g., from a high dopant concentration process gas to a low dopant concentration process gas, the new process gas travels in a uniform flow through reactor 314 similar to a curtain falling (see lines 336). As the bottom of this curtain passes substrates 316, the composition of the process gas contacting substrates 316 abruptly changes. Thus, an abrupt transition occurs between the layer formed from the process gas having the original gas composition and the new layer formed from the process gas having the new gas composition. Accordingly, use of dispersion head 330 enables formation of substrates 316 having abrupt transitions between layers using a relatively simple, reliable and cost effective barrel reactor 314.

Figure 3:
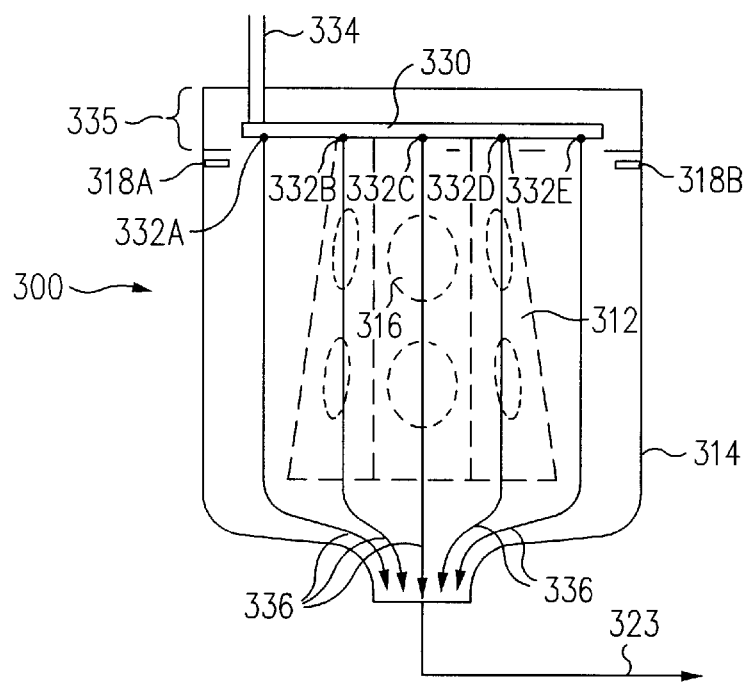
FIG. 3 is a schematic representation of a semiconductor processing system in accordance with the present invention.

More particularly, FIG. 3 is a schematic representation of a semiconductor processing system 300 in accordance with the present invention. System 300 includes reactor 314, e.g., a barrel reactor. Located within reactor 314, e.g., in a reactor volume typically defined by a quartz bell-jar of reactor 314, is a susceptor 312 and substrates 316 such as monocrystalline silicon wafers. Susceptor 312 and substrates 316 are illustrated in shadow lines in FIG. 3 so as not to detract from the principals of the invention. Also located within reactor 314 adjacent a seal plate 335 is one or more dispersion heads 330. Each dispersion head 330 includes a plurality of distributors 332A, 332B, 332C, 332D and 332E, e.g., apertures, hereinafter, distributors 332A to 332E.

During use, process gas flows to dispersion head 330 through a dispersion head coupling 334. Dispersion head 330 is hollow (has an internal channel) so that the process gas flows through the channel of dispersion head 330 to distributors 332A to 332E. Process gas flows through distributors 332A to 332E and into reactor 314. The process gas flows downwards, e.g., in a first direction, contacting substrates 316 thus forming a layer on substrates 316. The spent process gas is then exhausted from reactor 314 to exhaust 323.

Of importance, the process gas is dispersed uniformly about the perimeter of susceptor 312 by dispersion head 330 as the process gas enters reactor 314. While the present invention is not limited to any theory of operation, dispersing the process gas, and supplying the dispersed process gas to reactor 314, improves the flow characteristics of the process gas through reactor 314 by minimizing turbulence compared to the prior art. More particularly, use of dispersion head 330 reduces and/or eliminates turbulence and recirculation in the flow of process gas through reactor 314. Thus, the process gas travels through reactor 314 from dispersion head 330 to exhaust 323 in a uniform flow, i.e., in a curtain-like flow, as indicated by lines 336.

Since the process gas flow is uniform through reactor 314, the process gas uniformly contacts substrates 316. Accordingly, use of dispersion head 330 results in the formation of layers on substrates 316 having excellent thickness uniformity. Further, since dispersion head 330 disperses the process gas in a repeatable and predefined manner, calibration of dispersion head 330 is avoided.

This is in contrast to the prior art where the injectors 18A, 18B (FIG. 1) had to be calibrated for each reactor 14 and also had to be recalibrated when process parameters, e.g., flow rate of flow of process gas, were changed. Thus, use of dispersion head 330 (FIG. 3) is less time consuming, is less labor intensive and is more reliable than use of injectors 18A, 18B (FIG. 1) of the prior art. In addition, use of dispersion head 330 allows realization of an abrupt transition between layers as discussed below.

In one embodiment, system 300 includes injectors 318A, 318B. Injectors 318A, 318B are located in a gas ring (not shown, see gas ring 20 of FIG. 1 for an example) between seal plate 335 and reactor 314. Injectors 318A, 318B are substantially similar to injectors 18A, 18B of FIG. 1. Alternatively, injectors 318A, 318B are quartz and are moveable. For example, motors or micrometers, which are attached to injectors 318A, 318B, move injectors 318A, 318B thus allowing ready adjustment of injectors 318A, 318B.

Figure 4:
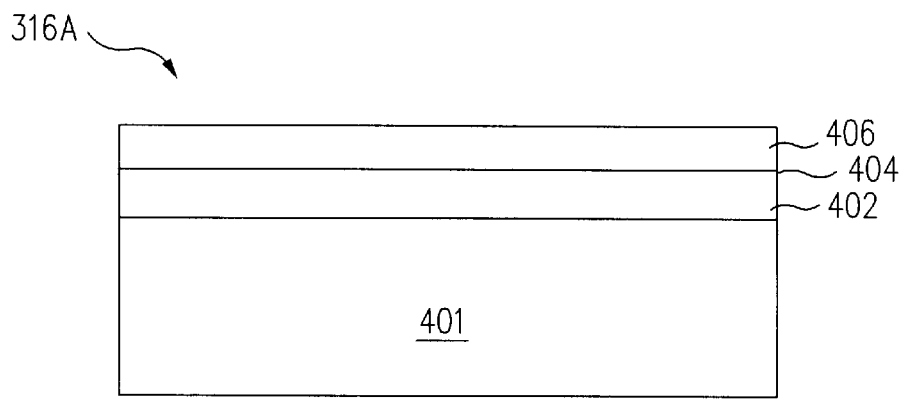
FIG. 4 is a cross-sectional view of a substrate after processing in accordance with the present invention.

FIG. 4 is a cross-sectional view of a substrate 316A after processing in accordance with the present invention. As shown in FIG. 4, substrate 316A includes a body 401, e.g., monocrystalline silicon. Substrate 316A further includes a first layer 402 on body 401, a second layer 406 and a transition layer 404 between layers 402, 406. For example, first layer 402 is a heavily doped P type silicon layer (hereinafter HD layer 402) and second layer 406 is a lightly doped P type silicon layer (hereinafter LD layer 406).

To form substrate 316A, referring to FIGS. 3 and 4 together, substrates 316 including substrate 316A are placed inside of reactor 314 and on susceptor 312. Substrates 316 are then heated in a conventional manner. A flow of process gas is supplied to dispersion head coupling 334 and thus to dispersion head 330.

For example, the process gas is a high dopant concentration gas mixture which includes a P type dopant gas in a carrier gas, and a source of silicon e.g., trichlorosilane. This process gas (hereinafter referred to as high dopant concentration process gas) flows through the internal channel of dispersion head 330 to and through distributors 332A to 332E of dispersion head 330 and into reactor 314. The high dopant concentration process gas contacts heated substrates 316 thus forming HD layer 402 on body 401.

Figure 5:
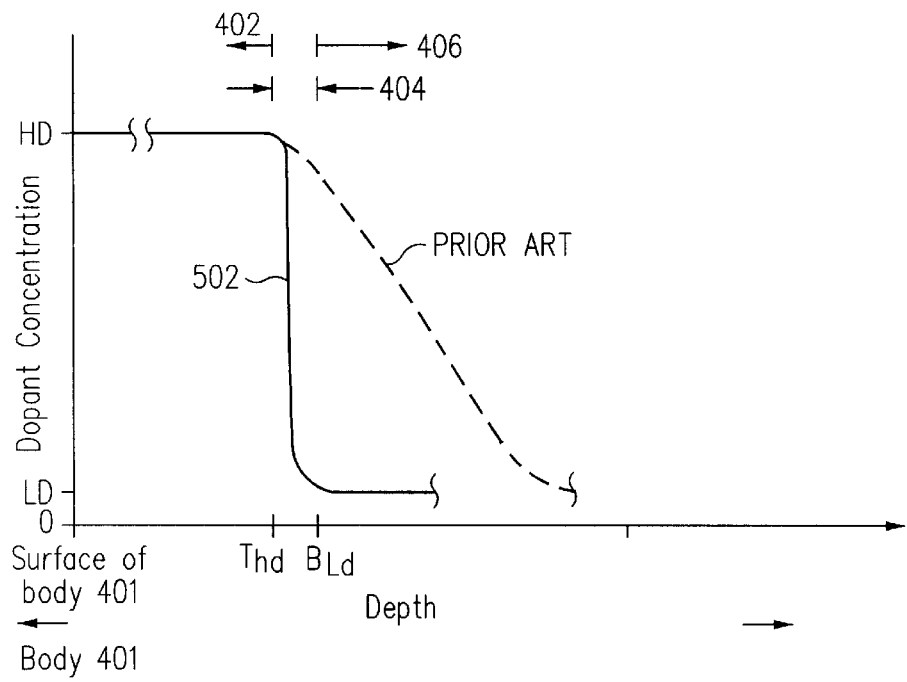
FIG. 5 is a graph of dopant concentration versus depth in the substrate of FIG. 4.

FIG. 5 is a graph of dopant concentration versus depth in substrate 316A of FIG. 4. As shown by a trace 502 in FIG. 5, HD layer 402 is a heavily doped P type silicon layer having a constant dopant concentration HD. The top of HD layer 402 is located at a distance Thd from the surface of body 401 which corresponds to the desired thickness of HD layer 402.

Referring to FIGS. 3, 4 and 5 together, after the desired thickness of HD layer 402 is formed, i.e., at distance Thd, the dopant concentration of the process gas supplied to dispersion head 330 is abruptly reduced or eliminated, e.g., using a gas flow controller system such as that described in Moore, related, co-filed and commonly assigned U.S. patent application Ser. No. 09/399,611, entitled "GAS FLOW CONTROLLER SYSTEM AND METHOD", which is herein incorporated by reference in its entirety.

This process gas (hereinafter referred to as low dopant concentration process gas although it is understood that no dopant gas may be present) exits dispersion head 330 through distributors 332A to 332E. The low dopant concentration process gas then travels in a uniform flow through reactor 314 similar to a curtain falling.

As the bottom of this curtain passes substrates 316, the dopant concentration of the process gas contacting substrates 316 abruptly changes from the high dopant concentration of the high dopant concentration process gas to the low dopant concentration of the low dopant concentration process gas. Thus, the dopant concentration abruptly falls off from the top of HD layer 402 to the bottom of LD layer 406, i.e., across the width of transition layer 404 from distance Thd to distance Bld. In one embodiment, the transition between HD layer 402 and LD layer 406 is such that HD layer 402 and LD layer 406 are continuous with one another and transition layer 404 is not formed. Accordingly, system 300 is well suited to meet the requirements of existing and emerging process technologies which demand abrupt transition between layers.

This is in contrast to the prior art (FIG. 2) where the dopant concentration of transition layer TL between layers L1, L2 gradually changed from heavily doped HD at the bottom of transition layer TL to lightly doped LD at the top of transition layer TL. As discussed in greater detail below with reference to FIG. 6, the present inventors have discovered that turbulence and recirculation in the flow of process gas through reactor 14 (FIG. 1) is one of the primary factors associated with the undesirable gradual dopant concentration transition of transition layer TL.

Figure 1:
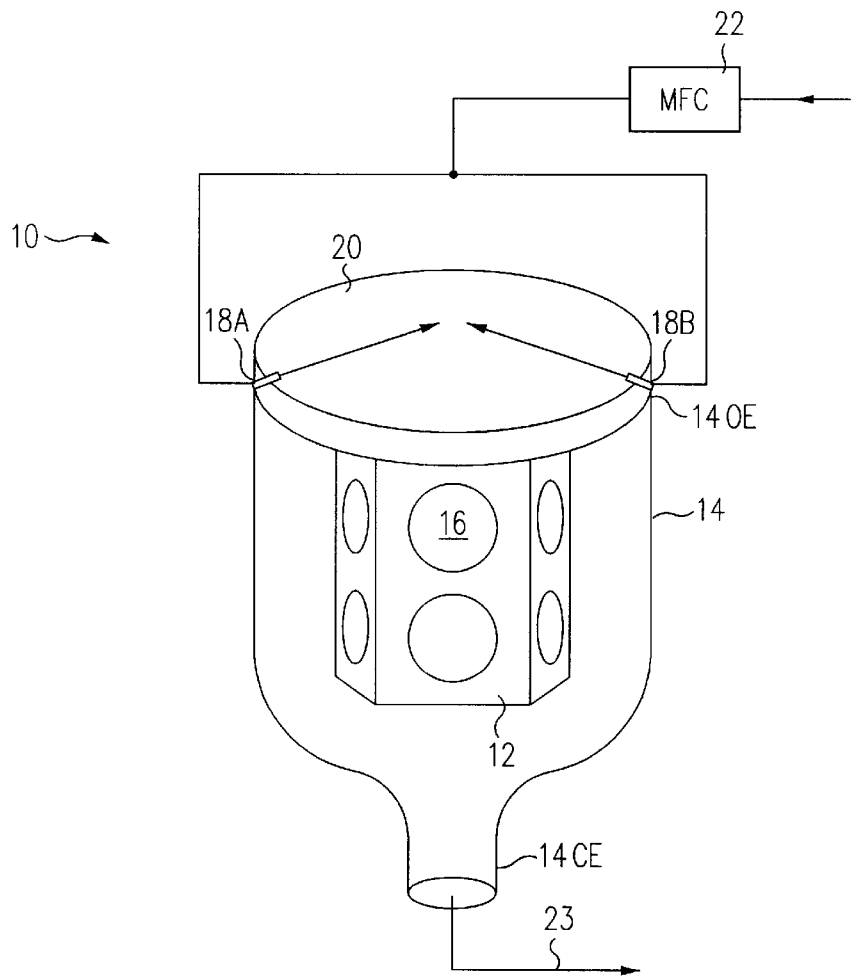
FIG. 1 is a schematic representation of a semiconductor processing system in accordance with the prior art.
Figure 2:
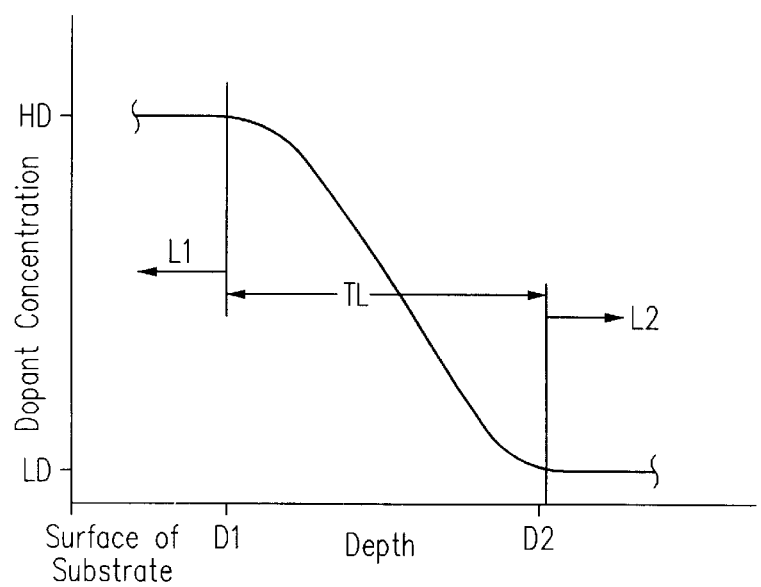
FIG. 2 is a graph of dopant concentration versus depth in a substrate in accordance with the prior art.
Figure 6:
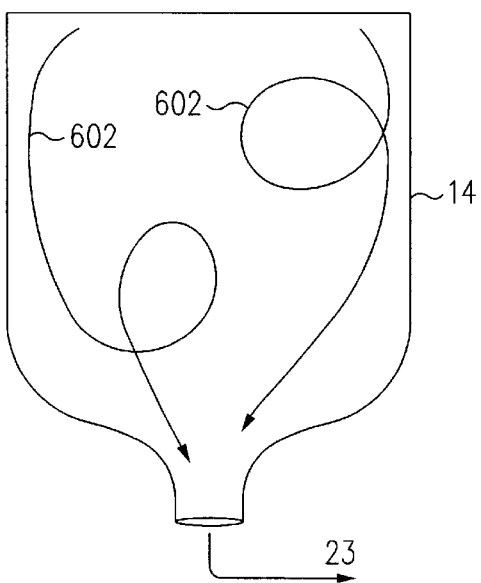
FIG. 6 is a schematic representation of the reactor of FIG. 1 illustrating turbulent process gas flow through the reactor as discovered by the present inventors.

FIG. 6 is a schematic representation of reactor 14 of FIG. 1 illustrating turbulent process gas flow through reactor 14 as discovered by the present inventors. In FIG. 6, susceptor 12, substrates 16, injectors 18A, 18B and gas ring 20 are not illustrated for purposes of clarity. As indicated by the lines 602, turbulence in the flow of the process gas through reactor 14 caused the process gas to recirculate one or more times in reactor 14 before it was finally exhausted to exhaust 23. Thus, when the process gas supplied to reactor 14 was abruptly changed, e.g., from a high dopant concentration process gas to a low dopant concentration process gas, the high dopant concentration process gas continued to mix with the newly introduced low dopant concentration process gas due to the recirculation.

As a result, the dopant concentration of the process gas in reactor 14 gradually decreased. Undesirably, this process gas in reactor 14 continued to react with and form transition layer TL (FIG. 2) having a dopant concentration which gradually changed from heavily doped HD at the bottom of transition layer TL to lightly doped LD at the top of transition layer TL.

In contrast, use of dispersion head 330 (FIG. 3) in accordance with the present invention produces a uniform process gas flow through reactor 314, i.e., avoids the turbulent gas flow and recirculation of the prior art. This enables formation of substrates 316A (FIG. 4) having abrupt transitions between layers (e.g., HD layer 402, LD layer 406) using a relatively simple, reliable and cost effective barrel reactor.

In an alternative embodiment, substrate 316A of FIG. 4 is formed using gas dispersion head 330 in conjunction with injectors 318A, 318B, which in this embodiment, are substantially similar to conventional injectors. In accordance with this embodiment, referring to FIGS. 3 and 4 together, substrates 316 including substrate 316A are placed inside of reactor 314 and on susceptor 312. After purging of reactor 314, a flow of carrier gas, e.g. hydrogen, is supplied to dispersion head 330. Substrates 316 are heated in a conventional manner.

After heating of substrates 316, a flow of process gas is supplied through injectors 318A, 318B to reactor 314. The flow of carrier gas is continuously supplied simultaneously to dispersion head 330, or, in an alternative embodiment, the flow of carrier gas to dispersion head 330 is shut-off as soon as the flow of process gas is supplied to injectors 318A, 318B. In either embodiment, the process gas (hereinafter referred to as high dopant concentration process gas) contacts heated substrates 316 thus forming HD layer 402 on body 401.

After the desired thickness of HD layer 402 is formed, the flow of the high dopant concentration process gas to injectors 318A, 318B is shut-off. The flow of carrier gas continues to dispersion head 330. Alternatively, if the flow of carrier gas was shut-off while the flow of the high dopant concentration process gas was supplied to injectors 318A, 318B, a new flow of carrier gas is supplied to dispersion head 330. In either embodiment, the carrier gas exits dispersion head 330 through distributors 332A to 332E and travels in a uniform flow through reactor 314 similar to a curtain falling.

The bottom of this curtain of carrier gas passes substrates 316 and displaces the high dopant concentration process gas in reactor 314. Thus, the formation of HD layer 402 is abruptly terminated and to the extent transition layer 404 is formed, transition layer 404 is not significant.

To form LD layer 406, the above procedure is repeated with the exception that a low dopant concentration process gas is used instead of the high dopant concentration process gas as those skilled in the art will understand.

Referring again to FIG. 4, substrate 316A includes both first layer 402 and second layer 406. As described above, in one embodiment, first layer 402 is a heavily doped P type silicon layer and second layer 406 is a lightly doped P type silicon layer. However, in an alternative embodiment, one or both of layer 402, 406 are N type or are undoped. In a further alternative, first layer 402 is lightly doped and second layer 406 is heavily doped. In another embodiment, only layer 402 is formed. In light of this disclosure, those of skill in the art will recognize that a variety of substrates such as those described above and numerous other variations can be formed using dispersion head 330.

Further, in one embodiment, dispersion head 330 is used during substrate cleaning, etching and/or other substrate treatment. Advantageously, use of dispersion head 330 allows an abrupt termination of the substrate cleaning, etching and/or other substrate treatment for reasons similar to those discussed above.

Dispersion head 330 in accordance with the present invention also improves the ability to control thickness of a deposited layer compared to the prior art. In particular, by supplying a uniform gas flow through reactor 314 (FIG. 3), the growth of the layer being formed is essentially instantaneously stopped upon shutting off the flow of the process gas from which the layer is formed. This is in contrast to the prior art (see FIG. 2) where transition layer TL had a substantial thickness equal to distance D2 at the top of transition layer TL minus distance D1 at the bottom of transition layer TL.

Figure 7A:
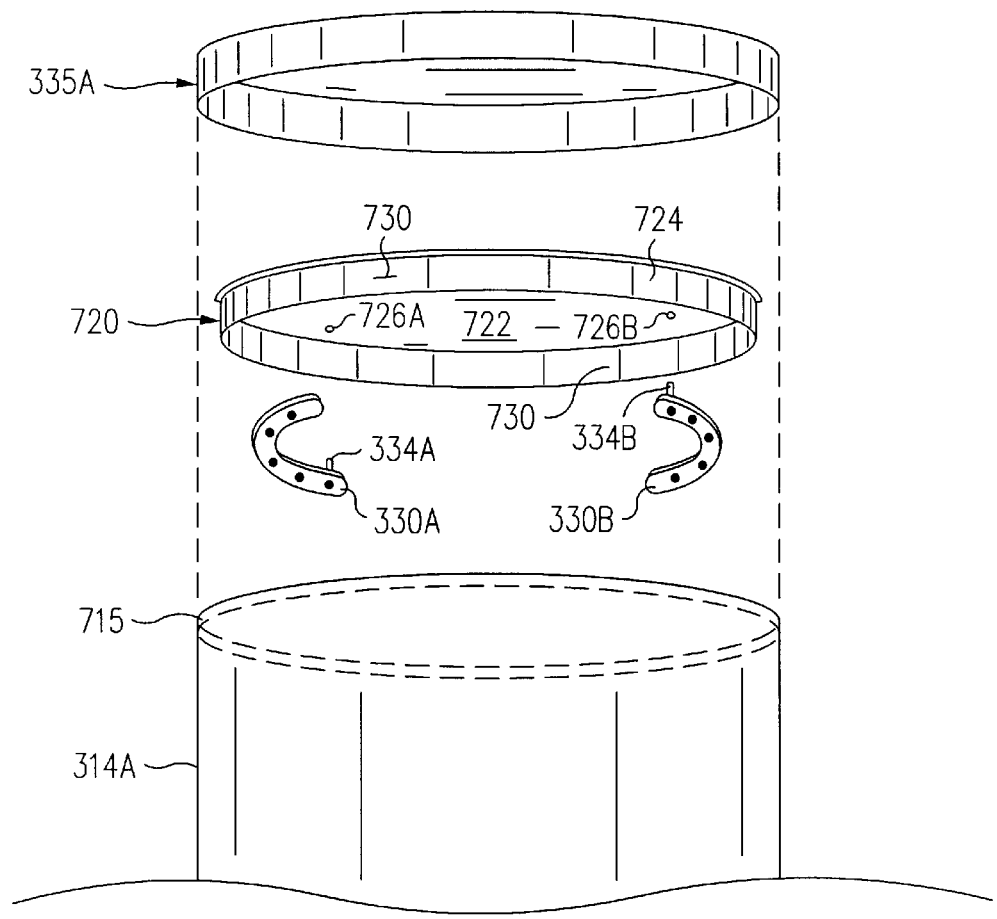
FIG. 7A is a lower perspective view of a seal plate, a purge baffle, dispersion heads and a reactor in accordance with one embodiment of the present invention.

FIG. 7A is a lower perspective view of a seal plate 335A, a purge baffle 720, dispersion heads 330A, 330B and reactor 314A in accordance with one embodiment of the present invention. Seal plate 335A forms a gas tight seal with an upper annular surface 715 of reactor 314A as is well known to those of skill in the art. Although a seal plate 335A is set forth, other structures instead of seal plate 335A are used in alternative embodiments. For example, in one embodiment, a gas ring between seal plate 335A and reactor 314A is used.

Mounted in a conventional manner to seal plate 335A is purge baffle 720. In this embodiment, purge baffle 720 is quartz and protects seal plate 335A, which is typically stainless steel, from process gas. Purge baffle 720 includes a flat plate like structure 722 and a lip 724 extending downwards, e.g., in a first direction, from structure 722. Purge baffle 720 is substantially similar to conventional purge baffles well known to those of skill in the art with the exception of apertures 726A, 726B and slots 730 which are discussed further below.

Dispersion heads 330A, 330B are located inside of the volume defined by structure 722 and lip 724 of purge baffle 720. Structure 722 has apertures 726A, 726B through which dispersion head couplings 334A, 334B, respectively, pass.

Figure 7B:
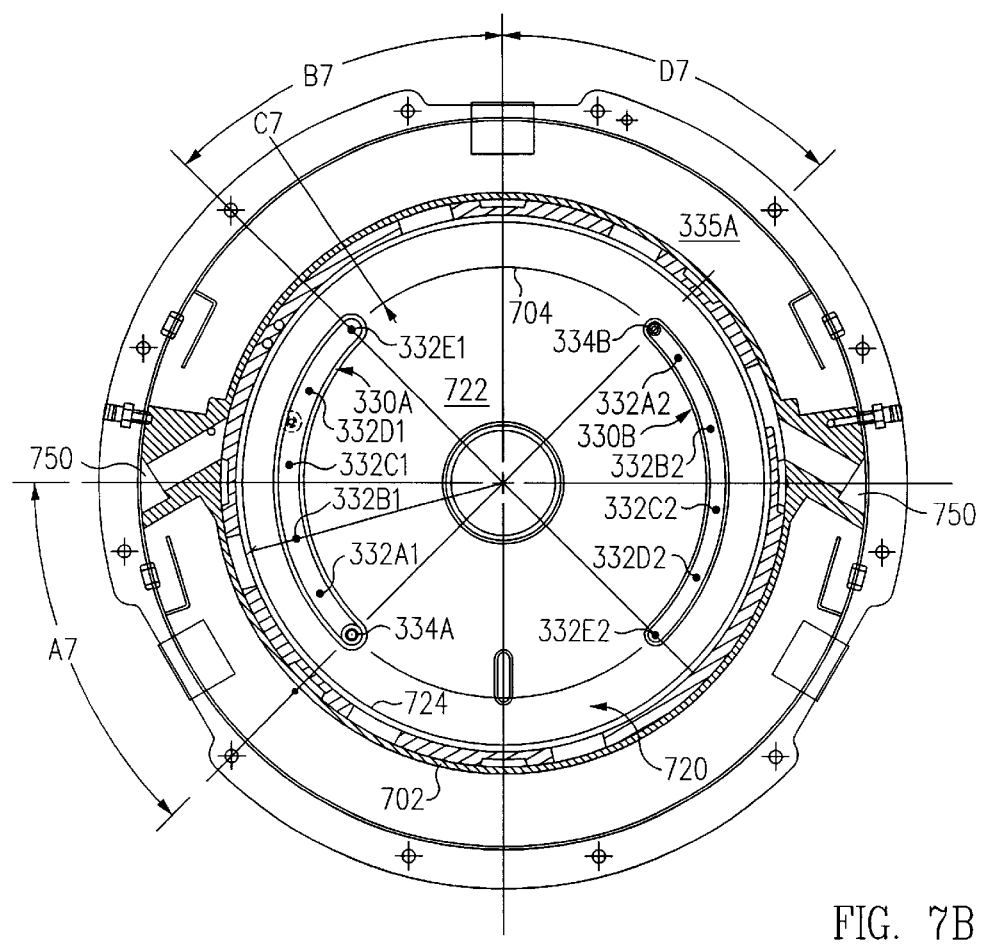
FIG. 7B is a bottom plan view of the seal plate and dispersion heads of FIG. 7A.

FIG. 7B is a bottom plan view of seal plate 335A and dispersion heads 330A, 330B of FIG. 7A in accordance with this embodiment of the present invention. Referring to FIGS. 7A and 7B together, seal plate 335A has an inner perimeter 702 which is similar in shape to a cross-section of reactor 314A. In particular, inner perimeter 702 is circular and reactor 314A has a circular cross-section, e.g., reactor 314A is cylindrical in shape.

To insure that the process gas distribution is complementary to the shape of reactor 314A, dispersion heads 330A, 330B are symmetrical with the cross-section of reactor 314A. More particularly, dispersion heads 330A, 330B lie on a common circle 704 which is concentric with the circular cross-sectional shape of reactor 314A. Further, distributors 332A1, 332B1, 332C1, 332D1, 332E1, 332A2, 332B2, 332C2, 332D2, 332E2 are centered on common circle 704. In this manner, the process gas enters reactor 314A in conformance with the inner shape of reactor 314A thus minimizing any turbulence in the flow of process gas which would otherwise result as the process gas conformed with the inner shape of reactor 314A.

In FIGS. 7A and 7B, two dispersion heads 330A, 330B spaced 180 degrees center to center apart on circle 704 from one another are illustrated. However, in alternative embodiment, more than two gas dispersion heads 330A and/or 330B are used. For example three, four or five gas dispersion heads 330A and/or 330B spaced 120, 90 or 72 degrees apart on circle 704 from one another, respectively, are used. Typically, gas dispersion heads 330A, 330B are uniformly spaced from one another to uniformly disperse the process gas. Alternatively, a single gas dispersion head 330A or 330B is used, e.g., shaped as a whole circle. In one embodiment, the number of dispersion heads 330A and/or 330B used is within the approximate range of one to fifty.

Further, five distributors 332A1 to 332El, 332A2 to 332E2 are illustrated in FIGS. 7A and 7B for each of dispersion heads 330A, 330B, respectively. However, in alternative embodiments, less than five distributors are used, e.g., one distributor, for each of dispersion heads 330A, 330B. Alternatively, more than five distributors are used for each of dispersion heads 330A, 330B. In one embodiment, the number of distributors used for each dispersion head is in the approximate range of one to fifty.

In FIGS. 7A and 7B, seal plate 335A is illustrated. However, in light of this disclosure, those skilled in the art will appreciate and understand that other seal rings, mechanisms to rotate susceptor 312 and other conventional items can be provided without detracting from the principals of the invention. For example, in one particular embodiment, one or more gas dispersion heads in accordance with the present invention is (are) used in combination with conventional gas injectors such as injectors 18A, 18B of FIG. 1. Positions, e.g. ports, for those injectors below seal plate 335A are identified as items 750 in FIG. 7B. Generally, see Moore, U.S. Pat. No. 5,207,835, herein incorporated by reference in its entirety, which describes in detail a barrel epitaxial reactor.

Illustrative specifications for the various characteristics illustrated in FIG. 7B are set forth below in Table 1.

TABLE 1

| CHARACTERISTIC | SPECIFICATION | UNIT |
|---|---|---|
| A7 | 45 | degrees |
| B7 | 45 | degrees |
| C7 | 5.092R | inches |
| D7 | 45 | degrees |

Figure 8:
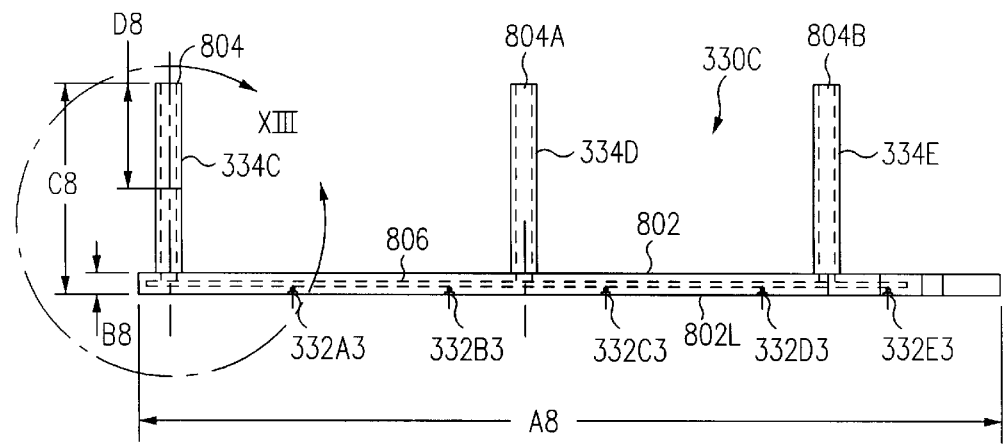
FIG. 8 is a side plan view of a dispersion head in accordance with one embodiment of the present invention.

FIG. 8 is a side plan view of a dispersion head 330C in accordance with one embodiment of the present invention. In this embodiment, dispersion head 330C is an infrared transparent material, e.g., is clear quartz such as GE 201 quartz. By forming dispersion head 330C of an infrared transparent material, heating of dispersion head 330C during heating of the substrates, e.g., substrates 316 of FIG. 3, is minimized thus reducing and essentially eliminating undesirable deposit formation on dispersion head 330C. Although a quartz dispersion head 330C is set forth, those of skill in the art will recognize that any number of heat sources can be used to heat the substrates, e.g., radiant, RF, resistive, plasma, or any other suitable heat source. In each case, the material selected for dispersion head 330C would be transparent to the radiant energy from the heat source.

Extending from a channel section 802 of dispersion head 330C is dispersion head coupling 334C. Dispersion head coupling 334C is integral with channel section 802, i.e., is the same piece. Alternatively, dispersion head coupling 334C is a separate piece attached to channel section 802, e.g., is a tube fused to channel section 802. Channel section 802 includes distributors 332A3, 332B3, 332C3, 332D3 and 332E3, hereinafter distributors 332A3 to 332E3.

Dispersion head coupling 334C has an internal channel 804 coupled to an internal channel 806 of channel section 802. Channel 806 is coupled to distributors 332A3 to 332E3. During use, process gas supplied to dispersion head coupling 334C flows through channel 804 to channel 806, flows through channel 806 to distributors 332A3 to 332E3 and flows through distributors 332A3 to 332E3 and into the reactor.

Depending upon the flow rate of the flow of process gas through channel 806 and the cross-sectional area of channel 806, a significant pressure drop in channel 806 may result. More particularly, the pressure in channel 806 may be significantly greater at distributor 332A3 adjacent to dispersion head coupling 334C than at distributor 332E3 located at the end of channel 806 opposite dispersion head coupling 334C. In this embodiment, distributors 332A3 to 332E3 are all the same, e.g., are apertures each having the same diameter. Thus, the significant pressure drop in channel 806 results in the flow rate of the flow of process gas: (1) through distributor 332A3 being the greatest; (2) through each of distributors 332B3, 332C3, 332D3 being gradually less; and (3) through distributor 332E3 being the least. This may be undesirable, e.g., may result in turbulence and/or the formation of layers lacking thickness uniformity.

To avoid this possible significant pressure drop in channel 806, in one embodiment, dispersion head 330C includes more than one dispersion head coupling 334C. For example, dispersion head 330C includes a second dispersion head coupling 334D near the center of channel section 802 and a third dispersion head coupling 334E located at an end of channel section 802 opposite dispersion head coupling 334C. Second and third dispersion head couplings 334D, 334E include channels 804A, 804B, respectively, coupled to channel 806 of channel section 802.

During use, process gas is supplied to dispersion head 330C at both ends and at the center of channel 806 through dispersion head couplings 334C, 334E and 334D, respectively. In this manner, significant pressure drops within channel 806 are avoided and the flow rate of the flow of process gas through each of distributors 332A3 to 332E3 is equal.

Illustrative specifications for the various characteristics illustrated in FIG. 8 are set forth below in Table 2.

TABLE 2

| CHARACTERISTIC | SPECIFICATION | UNIT |
|---|---|---|
| A8 | 8.50 | inches |
| B8 | 0.19 | inches |
| C8 | 1.98 | inches |
| D8 | 1.00* | inches |

*Note: Dimension indicates surface to be opaque quartz.

Figure 9:
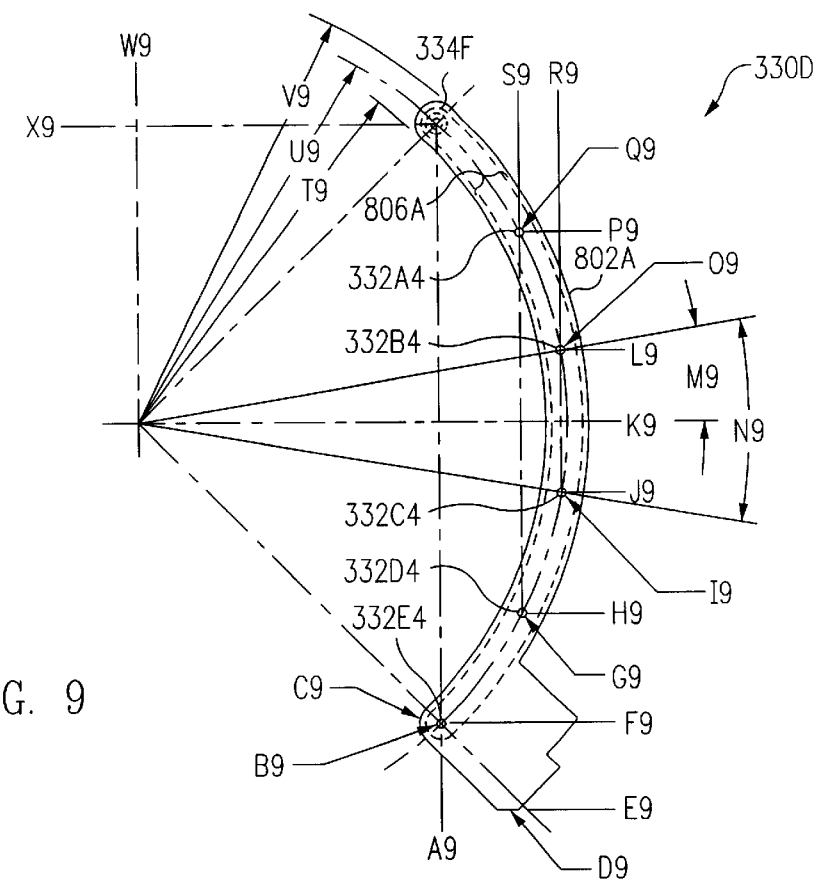
FIG. 9 is a bottom plan view of a dispersion head having variable diameter distributors in accordance with another embodiment of the present invention.

Alternatively, to compensate for the significant pressure drop in channel 806, distributors 332A3 to 332E3 are formed with various cross-sectional areas. FIG. 9 is a bottom plan view of a dispersion head 330D having variable diameter distributors 332A4, 332B4, 332C4, 332D4 and 332E4, hereinafter distributors 332A4 to 332E4, in accordance with another embodiment of the present invention.

In this embodiment, a single dispersion head coupling 334F is provided adjacent one, e.g., a first, end of channel section 802A. During use, a significant pressure drop exists within channel 806A for reasons similar to those discussed above. However, to compensate for this significant pressure drop, distributor 332A4 adjacent dispersion head coupling 334F is formed with a smaller cross-sectional area than distributor 332E4 adjacent the other opposite, e.g., second, end of channel section 802A opposite dispersion head coupling 334F. Distributors 332B4, 332C4, 332D4 have cross-sectional areas which gradually increase from distributor 332B4 to distributor 332D4.

As a result, although the pressure in channel 806A is significantly greater at distributor 332A4 than at distributor 332E4, the flow rates of the flows of process gas through each of distributors 332A4 to 332E4 are substantially equal. This, in turn, essentially eliminates turbulence in the flow of process gas through the reactor.

Illustrative specifications for the various characteristics illustrated in FIG. 9 are set forth below in Table 3.

TABLE 3

| CHARACTERISTIC | SPECIFICATION | UNIT |
|---|---|---|
| A9 | 3.601 | inches |
| B9 | 0.080 thru one wall only 0.108 × 90° C.' sink | inches |
| C9 | R.26 2X | inches |
| D9 | 0.27 × 45° chamfer | inches |
| E9 | 8.23 | inches |
| F9 | 7.202 | inches |
| G9 | 0.060 thru one wall only 0.108 × 90° C.' sink | inches |
| H9 | 5.912 | inches |
| I9 | 0.050 thru one wall only 0.108 × 90° C.' sink | inches |
| J9 | 4.398 | inches |
| K9 | 3.601 | inches |
| L9 | 2.804 | inches |
| M9 | 9 | degrees |
| N9 | 18 | degrees |
| O9 | 0.040 thru one wall only 0.108 × 90° C.' sink | inches |
| P9 | 1.289 | inches |
| Q9 | 0.030 thru one wall only 0.108 × 90° C.' sink | inches |
| R9 | 5.030 | inches |

TABLE 3-continued

| CHARACTERISTIC | SPECIFICATION | UNIT |
|---|---|---|
| S9 | 4.538 | inches |
| T9 | R4.83 | inches |
| U9 | R5.093 | inches |
| V9 | R5.36 | inches |
| W9 | .000 | inches |
| X9 | .000 | inches |

In the discussion above, the various distributors 332 are described as apertures. These apertures can be formed in a variety of shapes and are typically circular in cross-section. Further, apertures having circular cross-sections are formed with fixed diameters along the length of the aperture such that the aperture is cylindrical in shape. Alternatively, an inner, e.g., first, portion of the aperture is cylindrical and an outer, e.g., second, portion of the aperture is flared to enhance dispersion of the process gas as it exits the aperture. For example, distributors 332A3 to 332E3 in FIG. 8 have inner cylindrical portions and outer portion which are conical in shape having base sections at lower surface 802L of channel section 802. However, distributors having other shapes are used in other embodiment such as those illustrated in FIGS. 10 and 11.

Figures 10, 11, 12:
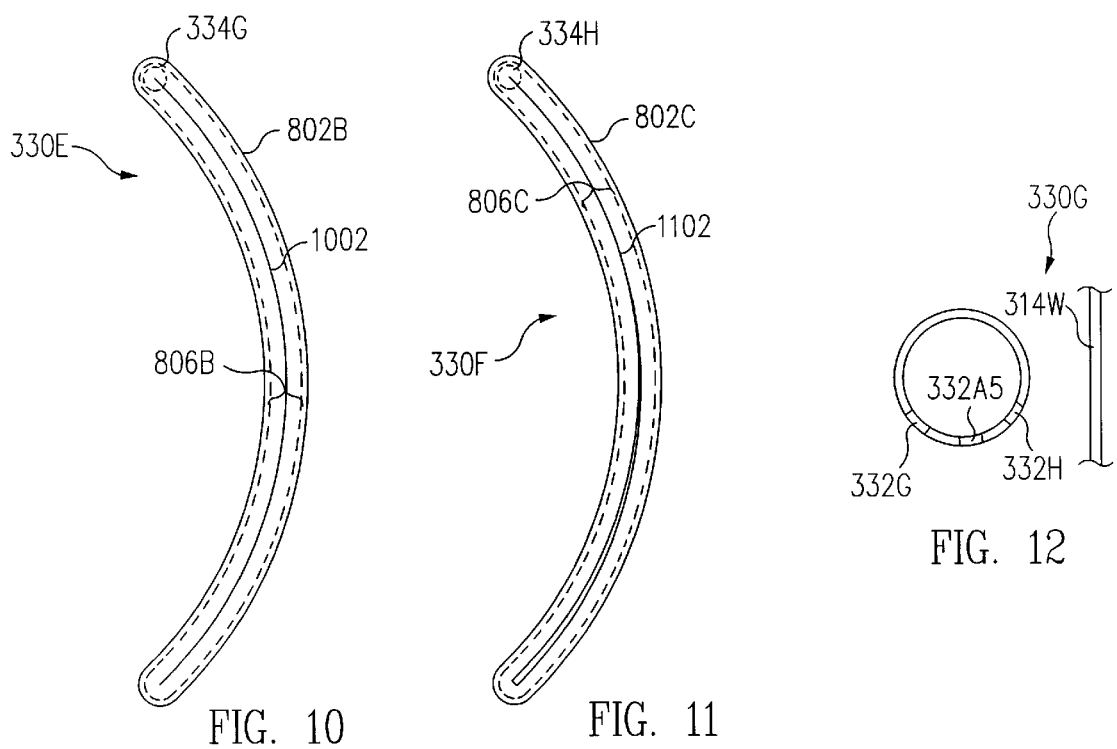
FIG. 10 is a bottom plan view of a dispersion head having a slit-like distributor in accordance with an alternative embodiment of the present invention.
FIG. 11 is a bottom plan view of a dispersion head having a variable width slit-like distributor in accordance with yet another alternative embodiment of the present invention.
FIG. 12 is a cross-section view of a tubular dispersion head in accordance with another embodiment of the present invention.

FIG. 10 is a bottom plan view of dispersion head 330E having a slit-like distributor 1002 in accordance with an alternative embodiment of the present invention. In this embodiment, distributor 1002 is a single slit extending along the length of channel section 802B. During use, process gas exits distributor 1002 as a continuous curtain.

FIG. 11 is a bottom plan view of dispersion head 330F having a variable width slit-like distributor 1102 in accordance with yet another alternative embodiment of the present invention. In this embodiment, distributor 1102 is a single slit extending along the length of channel section 802C. Further, the width of distributor 1102 generally increases in proportion to the distance from dispersion head coupling 334H, i.e., distributor 1102 is narrower adjacent dispersion head coupling 334H than away from dispersion head coupling 334H. In this manner, a significant pressure drop in channel 806C is compensated for by the increasing width of distributor 1102 resulting in a uniform flow rate of flow of process gas along the entire length of distributor 1102. As a result, process gas exits distributor 1102 as a continuous curtain.

FIG. 12 is a cross-section view of a tubular dispersion head 330G in accordance with another embodiment of the present invention. In this embodiment, dispersion head 330G is a tube, e.g., a quartz tube. A distributor 332A5, which is an aperture of dispersion head 330G, is vertically orientated to direct process gas vertically downwards into the reactor in a direction substantially parallel to wall 314W of the reactor. Alternatively, or in addition, an inwardly orientated distributor 332G of dispersion head 330G directs process gas towards the center of the reactor, i.e., away from wall 314W. As a further alternative, or as a further addition, an outwardly orientated distributor 332H of dispersion head 330G directs process gas away from the center of the reactor, i.e., towards wall 314W. By using the proper combination of distributors 332A5, 332G, and/or 332H for a particular design of a reactor, turbulence in the flow of process gas through the reactor is minimized or avoided.

Figure 13:
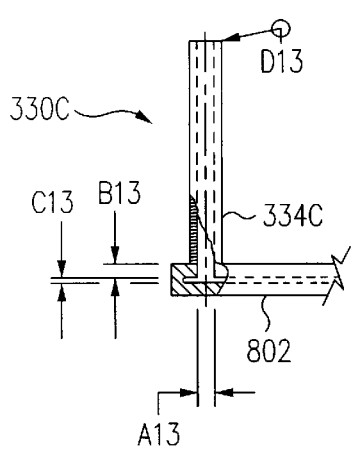
FIG. 13 is an enlarged side plan view of the section XIII of the dispersion head of FIG. 8.

FIG. 13 is an enlarged side plan view of the section XIII of dispersion head 330C of FIG. 8. As discussed above, process gas is supplied to dispersion head 330C through dispersion head coupling 334C. In accordance with this embodiment, dispersion head coupling 334C is also used as a mount to support dispersion head 330C inside of reactor 314 as discussed below in reference to FIG. 14.

Illustrative specifications for the various characteristics illustrated in FIG. 13 are set forth below in Table 4.

TABLE 4

| CHARACTERISTIC | SPECIFICATION | UNIT |
|---|---|---|
| A13 | 0.150 | inches |
| B13 | 0.08 | inches |
| C13 | 0.040 | inches |
| D13 | R0.020 | inches |

Figure 14:
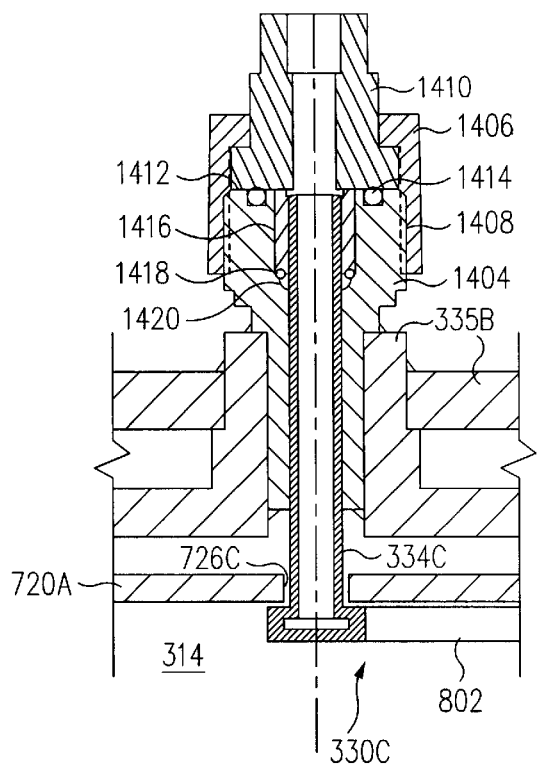
FIG. 14 is a cross-sectional view of a mounting for a dispersion head in accordance with the present invention.

FIG. 14 is a cross-sectional view of a mounting for dispersion head 330C in accordance with the present invention. As shown in FIG. 14, dispersion head coupling 334C extends through an aperture 726C of purge baffle 720A and into gland 1404. Gland 1404 is fixedly attached, e.g., threaded or welded, to seal plate 335B. A nut 1406 is threaded to an exterior surface 1408 of gland 1404 and presses a gas fitting 1410 down onto an upper surface 1412 of gland 1404. A gas line (not shown) is coupled to gas fitting 1410 using conventional techniques. An O-ring 1414 is located in a groove of surface 1412 and forms a seal between gland 1404 and gas fitting 1410 which prevents process gas from leaking into the ambient environment.

In addition to pressing gas fitting 1410 on to O-ring 1414, nut 1406 also presses gas fitting 1410 down onto a compression insert 1416. Compression insert 1416, in turn, presses against an O-ring 1418 between dispersion head coupling 334C and a tapered interior surface 1420 of gland 1404. Due to the taper of interior surface 1420, O-ring 1418 presses against dispersion head coupling 334C inwards towards the longitudinal axis of dispersion head coupling 334C. Accordingly, O-ring 1418 forms a seal between dispersion head coupling 334C and gland 1404 which prevents process gas from leaking into the reactor. At the same time, O-ring 1418 holds dispersion head coupling 334C in place. In this manner, dispersion head 330C is mounted inside of reactor 314.

Mounting dispersion head 330C in the above manner can place dispersion head 330C under stress. More particularly, the significant length of channel section 802 hanging from dispersion head coupling 334C can place dispersion head coupling 334C and the junction between dispersion head coupling 334C and channel section 802 under stress. Since dispersion head 330C is typically formed of quartz or a similar material, stress can crack dispersion head 330C in certain instances. To avoid this potential cracking, a support is placed at the end of channel section 802 opposite dispersion head coupling 334C as shown in FIG. 15.

Figure 15:
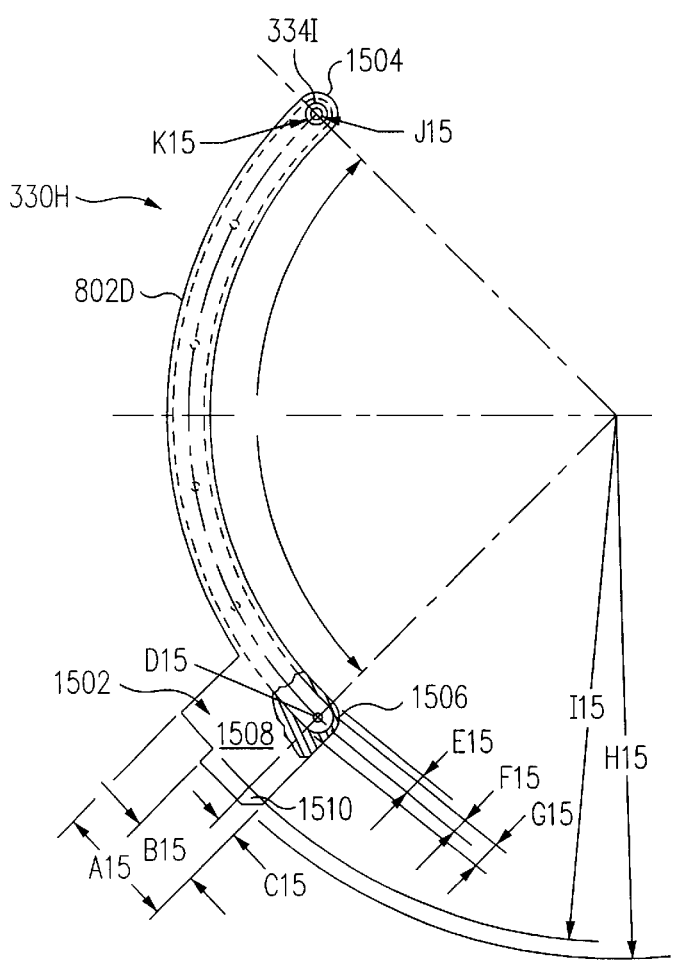
FIG. 15 is a bottom plan view of a dispersion head having a stress relief support in accordance with one embodiment of the present invention.

FIG. 15 is a bottom plan view of dispersion head 330H having a stress relief support 1502 in accordance with one embodiment of the present invention. As shown in FIG. 15, dispersion head coupling 334I is located at a first end 1504 of channel section 802D. Support 1502 is located at a second end 1506 of channel section 802D opposite first end 1504. Support 1502 extends radially outward from channel section 802D. Support 1502 includes a body portion 1508 and a tab 1510 extending from body portion 1508. When mounted, tab 1510 is positioned in a slot, e.g., in slot 730 in purge baffle 720 (see FIG. 7A) or a slot in a seal plate, and thus supports end 1506 of channel section 802D. As discussed above, dispersion head coupling 334I supports end 1504 of channel section 802D. By supporting both ends 1504, 1506 of channel section 802D, any stress in dispersion head 330H is minimized and cracking is avoided.

Illustrative specifications for the various characteristics illustrated in FIG. 15 are set forth below in Table 5.

TABLE 5

| CHARACTERISTIC | SPECIFICATION | UNIT |
|---|---|---|
| A15 | 1.39 | inches |
| B15 | 0.87 | inches |
| C15 | 0.266 | inches |
| D15 | FULL RAD 2X | |
| E15 | 0.079 | inches |
| F15 | 0.188 | inches |
| G15 | 0.375 | inches |
| H15 | R6.49 | inches |
| I15 | R6.217 | inches |
| J15 | 0.150 thru one wall only | inches |
| K15 | 0.250 | inches |

Advantageously, returning to FIG. 3, dispersion heads 330 can be mounted in reactor 314 in a variety of fashions. Recall that in the prior art (FIG. 1), injectors 18A, 18B were mounted in a gas ring 20. Since use of gas ring 20 was required in the prior art, injectors 18A, 18B were necessarily mounted at open end 140E of reactor 14. Thus, in the prior art, the possibility of supplying the process gas at the closed end 14CE of reactor 14 was precluded.

Figure 16:
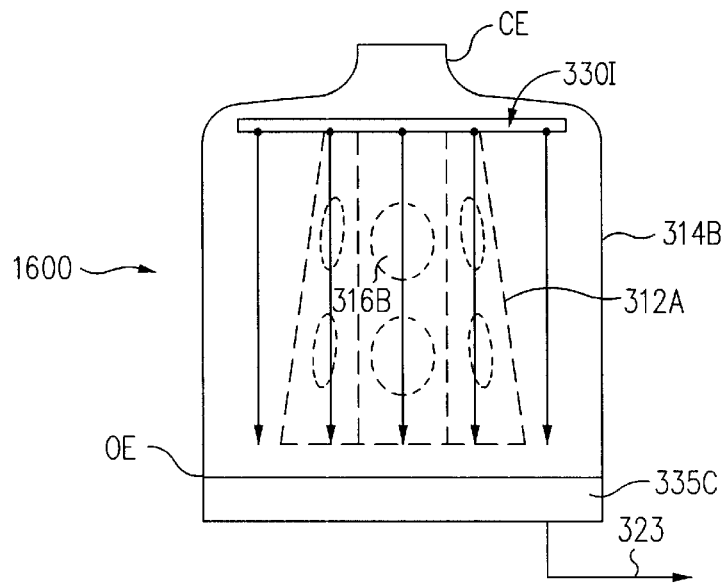
FIG. 16 is a schematic representation of a semiconductor processing system having an inverted barrel reactor in accordance with another embodiment of the present invention.

FIG. 16 is a schematic representation of a semiconductor processing system 1600 having an inverted barrel reactor 314B in accordance with another embodiment of the present invention. Reactor 314B is a bell-jar as an example. However, in accordance with this embodiment, reactor 314B is inverted compared to reactor 314 of FIG. 3 so that an open end OE of reactor 314B is at the bottom of reactor 314B and a closed end CE of reactor 314B is at the top of reactor 314B. Gas dispersion head 330I is mounted adjacent closed end CE of reactor 314B opposite open end OE using any of a number of conventional mounting techniques well known to those skilled in the art. A seal plate 335C forms a seal with open end OE. Located within reactor 314B is a susceptor 312A and substrates 316B which are illustrated in shadow lines in FIG. 16 so as not to detract from the principals of the invention.

In accordance with this embodiment, susceptor 312A including substrates 316B are loaded into reactor 314B through open end OE, i.e., through the bottom of reactor 314B. This may be advantageous depending upon the particular application.

During use, process gas is supplied through dispersion head 330I at the top of reactor 314B adjacent closed end CE. The process gas flows uniformly downwards through reactor 314B contacting and forming a layer on substrates 316B. The spent process gas is then exhausted from reactor 314B through seal plate 335C to exhaust 323.

Figure 17A:
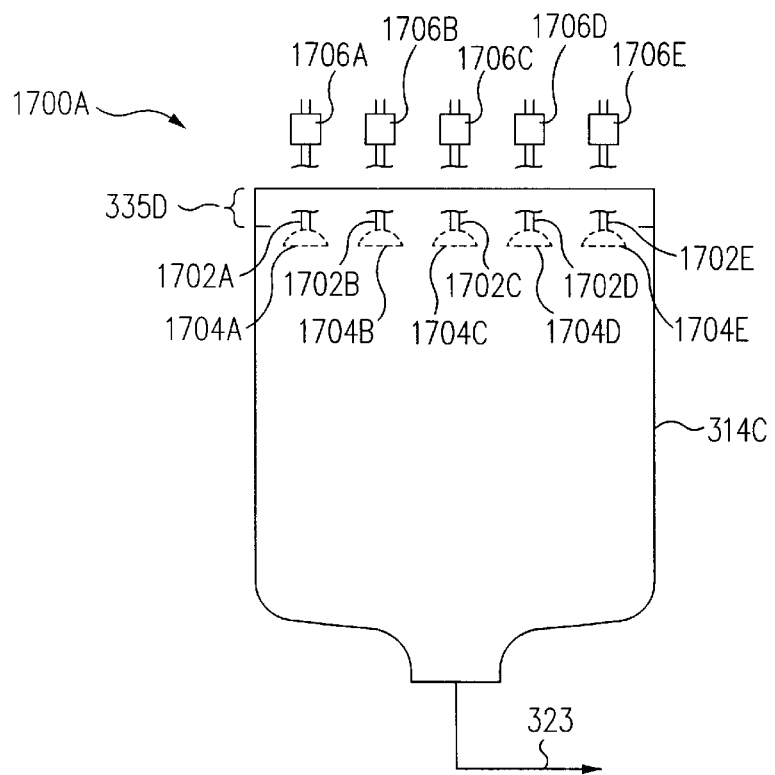
FIG. 17A is a schematic representation of a semiconductor processing system having a plurality of dispersion heads in accordance with another embodiment of the present invention.

FIG. 17A is a schematic representation of a semiconductor processing system 1700A having a plurality of dispersion heads 1702A, 1702B, 1702C, 1702D, 1702E, hereinafter dispersion heads 1702A to 1702E, in accordance with another embodiment of the present invention. System 1700A includes a reactor 314C, e.g., a barrel reactor. In accordance with this embodiment, each of dispersion heads 1702A to 1702E is a different tube of a plurality of tubes, e.g., quartz tubes, extending into reactor 314C through ports of seal plate 335D and the distributors are the ends of these tubes. Thus, a different single flow of process gas exits from each of dispersion heads 1702A to 1702E. Optional, dispersion heads 1702A to 1702E include showerhead-like distributors 1704A, 1704B, 1704C, 1704D, 1704E, hereinafter distributors 1704A to 1704E, which disperse the flows of process gas from dispersion heads 1702A to 1702E, respectively.

The flow rates of the flows of process gas to dispersion heads 1702A to 1702E are controlled by mass flow controllers (MFCs) or BMV metering valves, i.e., regulators, 1706A, 1706B, 1706C, 1706D, 1706E, hereinafter MFCS 1706A to 1706E, coupled to dispersion heads 1702A to 1702E, respectively. Use of MFCs 1706A to 1706E allows the flow characteristics of the flow of process gas through reactor 314C to be accurately controlled. For example, although use of dispersion heads 1702A to 1702E disperses the process gas in a repeatable and predefined manner, in some instances, it may be desirable to adjust the flow rates of the flows of process gas to dispersion heads 1702A to 1702E with MFCs 1706A to 1706E, respectively. These adjustments may include increasing the flow rates of the flows of process gas to particular ones of dispersion heads 1702A to 1702E and/or reducing the flow rates of the flows of process gas to other ones of dispersion heads 1702A to 1702E.

Figure 17B:
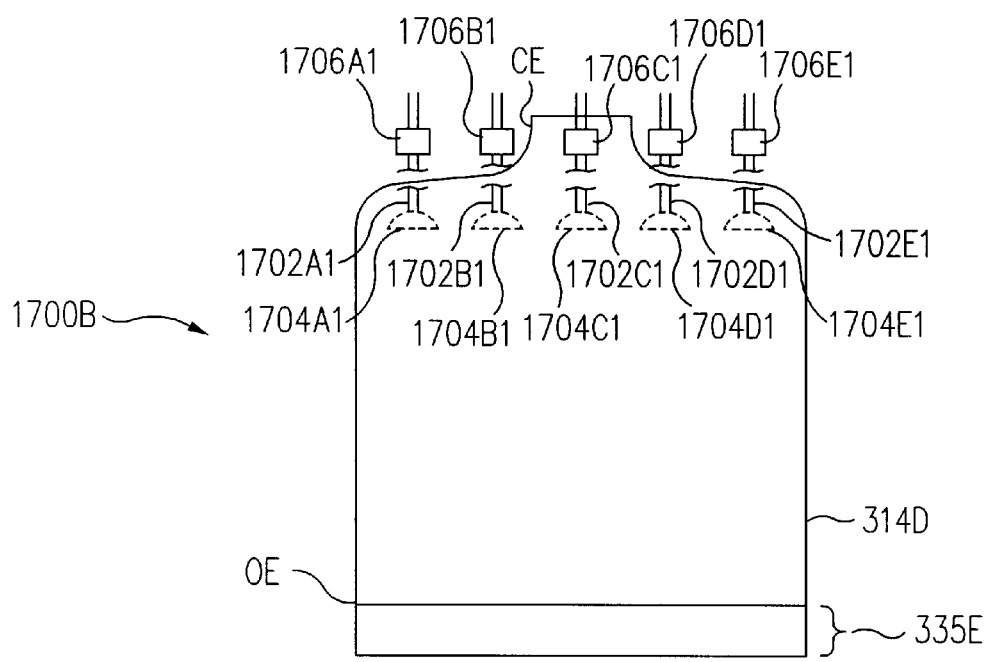
FIG. 17B is a schematic representation of a semiconductor processing system having an inverted barrel reactor in accordance with another embodiment of the present invention.

FIG. 17B is a schematic representation of a semiconductor processing system 1700B having an inverted barrel reactor 314D in accordance with another embodiment of the present invention. System 1700B of FIG. 17B is substantially similar to system 1700A of FIG. 17A with the exception that reactor 314D in FIG. 17B is inverted compared to reactor 314C of FIG. 17A. More particularly, open end OE of reactor 314D, which is a bell-jar as an example, is at the bottom of reactor 314D. Dispersion heads 1702A1 to 1702E1 are adjacent closed end CE of reactor 314D opposite open end OE. In one embodiment, dispersion heads 1702A1 to 1702E1 are tubes extending through ports of reactor 314D.

In light of this disclosure, it is understood that use of mass flow controllers (MFCS) is not limited to the particular embodiments illustrated in FIGS. 17A and 17B, and that MFCs can also be used to control the flow rate of the flow of process gas to other gas dispersion heads in accordance with the present invention. For example, first and second MFCs are coupled to, and used to control the flow rates of the flows of process gas to, dispersion heads 330A, 330B, respectively, of FIGS. 7A and 7B. As a further example, first, second and third MFCs are used to control the flow rates of the flows of process gas to dispersion head couplings 334C, 334D, 334E, respectively, of FIG. 8.

Recall that in the prior art (FIG. 1), a single MFC 22 was used to control the flow rate of the flow of process gas to both injectors 18A, 18B. Thus, there was no ability to control the flow characteristics of the flow of process gas through reactor 14 by controlling the flow rate of the flow of process gas through each of injectors 18A, 18B in the prior art.

Figure 18:
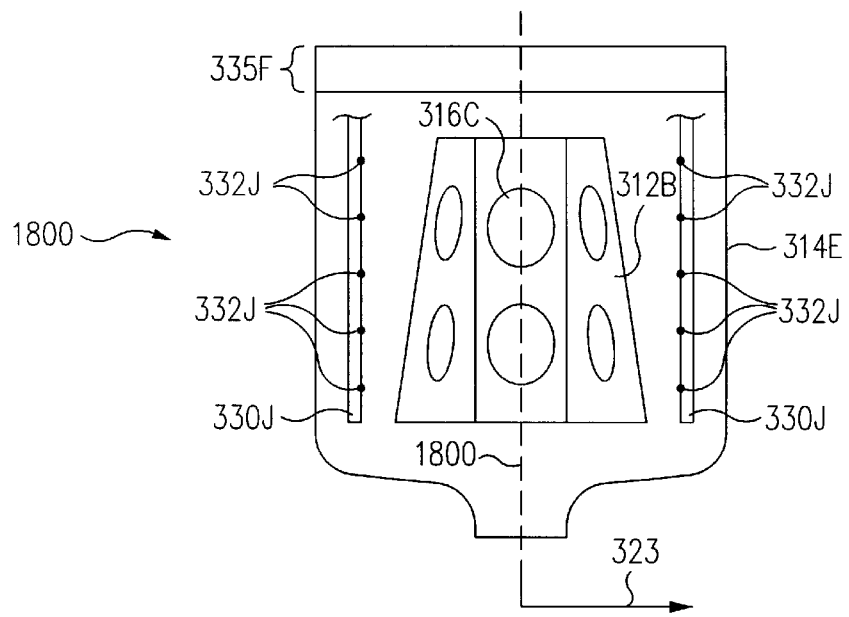
FIG. 18 is a schematic representation of a semiconductor processing system having vertically orientated dispersion heads in accordance with another embodiment of the present invention.

FIG. 18 is a schematic representation of a semiconductor processing system 1800 having vertically orientated dispersion heads 330J in accordance with another embodiment of the present invention. In this embodiment, dispersion heads 330J are substantially parallel to the longitudinal axis 1800 of reactor 314E, i.e., dispersion heads 330J extend downwards in the vertical direction. Of importance, unreacted process gas is supplied along the length of reactor 314E through distributors 332J of dispersion heads 330J. Accordingly, each substrate 316C contacts unreacted process gas from adjacent distributors 332J, which may be advantageous depending on the particular application.

Figure 19:
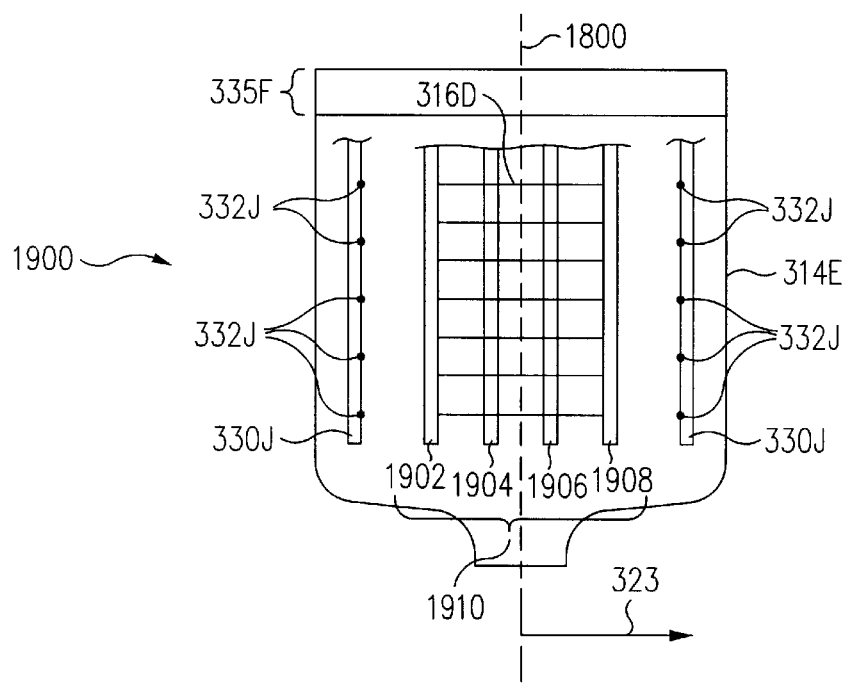
FIG. 19 is a schematic representation of a semiconductor processing system having a horizontal substrate carrier in accordance with another embodiment of the present invention.

In various figures above, e.g., see FIG. 3, susceptor 312 is a vertical substrate carrier such that the principal surfaces of substrates 316 are orientated vertically, albeit at a slight taper angle as is well known to those skilled in the art. However, in light of this disclosure, it is understood that substrates 316 can have other orientations, e.g., horizontal orientations. As used herein, horizontally or vertically means in a plane substantially perpendicular or parallel, respectively, to longitudinal axis 1800 of reactor 314E. For example, referring to FIG. 19, substrates 316D are supported such that the principal surfaces of substrates 316D are horizontal in reactor 314E. More particularly, substrates 316D are held in notches of rods 1902, 1904, 1906, 1908 which collectively form a horizontal substrate carrier 1910. Although carrier 1910 having rods 1902, 1904, 1906, 1908 is set forth, other horizontal substrate carriers can also be used. For example, plate type horizontal substrate carriers can be used.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A system comprising:

a barrel reactor having a circular cross-sectional shape;

a first dispersion head within said barrel reactor, said first dispersion head comprising at least one distributor, said at least one distributor comprising a first distributor, a second distributor, and a third distributor, said first dispersion head and said first distributor, said second distributor, and said third distributor lying on a circle, said circle being concentric with said circular cross-sectional shape; and a second dispersion head, said second dispersion head lying on said circle.

2. The system of claim 1 further comprising:

a first regulator coupled to said first dispersion head; and a second regulator coupled to said second dispersion head.

3. The system of claim 1 further comprising a horizontal substrate carrier.

4. The system of claim 1 wherein said at least one distributor is centered on said circle.

5. The system of claim 1 wherein said first dispersion head comprises a tube and said at least one distributor comprises an aperture in said tube, said aperture having an orientation with respect to said barrel reactor, said orientation being selected from the group consisting of a downward orientation, an inward orientation and an outward orientation.

6. The system of claim 1 wherein a center of said first dispersion head is spaced 180 degrees apart on said circle from a center of said second dispersion head.

7. The system of claim 1 wherein said first dispersion head comprises an infrared transparent material.

8. The system of claim 7 wherein said infrared transparent material comprises quartz.

9. The system of claim 1 wherein said first dispersion head further comprises a first dispersion head coupling.

10. The system of claim 9 wherein said first dispersion head further comprises a channel section, said channel section comprising said at least one distributor.

11. The system of claim 10 wherein said first dispersion head coupling comprises a channel coupled to a channel of said channel section, said channel of said channel section being coupled to said at least one distributor.

12. The system of claim 11 wherein said first dispersion head further comprises a second dispersion head coupling having a channel coupled to said channel of said channel section.

13. The system of claim 1 wherein said barrel reactor has an open end and a closed end opposite said open end, said first dispersion head being located adjacent said closed end.

14. The system of claim 13 wherein a seal plate forms a seal with said open end.

15. The system of claim 13 wherein said barrel reactor is a bell-jar.

16. The system of claim 9 wherein said first dispersion head coupling is a mount for supporting said first dispersion head in said barrel reactor.

17. The system of claim 16 wherein said first dispersion head coupling is located at a first end of a channel section of said first dispersion head, said first dispersion head further comprising a support at a second end of said channel section opposite said first end.

18. The system of claim 1 wherein said first distributor comprises an aperture.

19. The system of claim 18 wherein said aperture has a first cylindrical portion and a second flared portion.

20. A system comprising:
a barrel reactor;
a first dispersion head within said barrel reactor, said first dispersion head comprising:
at least one distributor;
a first dispersion head coupling, wherein said first dispersion head coupling is a mount for supporting said first dispersion head in said barrel reactor, said first dispersion head coupling being located at a first end of a channel section of said first dispersion head; and
a support at a second end of said channel section opposite said first end; and
a purge baffle having a slot, said support being positioned in said slot.

21. The system of claim 20 wherein said at least one distributor comprises a slit.

22. A system comprising:
a reactor having a circular cross-sectional shape;
a first dispersion head within said reactor, said first dispersion head comprising at least one distributor, said at least one distributor comprising a first distributor, a second distributor, and a third distributor, said first dispersion head and said first distributor, said second distributor, and said third distributor lying on a circle, said circle being concentric with said circular cross-sectional shape;
a second dispersion head, said second dispersion head lying on said circle;
a horizontal substrate carrier; and
a substrate, a principal surface of said substrate being substantially perpendicular to a longitudinal axis of said reactor.

23. A system comprising:
a barrel reactor having a circular cross-sectional shape;
a first dispersion head within said barrel reactor, said first dispersion head comprising a first distributor, a second distributor, and a third distributor, wherein said first distributor, said second distributor, and said third distributor of said first dispersion head are centered on a circle concentric with said circular cross-sectional shape; and
a second dispersion head comprising a first distributor, a second distributor, and a third distributor, wherein said first distributor, said second distributor, and said third distributor of said second dispersion head are centered on said circle.

24. The system of claim 23 wherein said first dispersion head and said second dispersion head lie on said circle.

25. A system comprising:
a barrel reactor;
a seal plate;
a gas ring between said seal plate and said barrel reactor;
at least one gas injector located in said gas ring; and
a first dispersion head within said barrel reactor and adjacent said seal plate, said first dispersion head comprising at least one distributor.

26. The system of claim 25 wherein said barrel reactor has a cross-sectional shape, said cross-sectional shape being circular, said first dispersion head lying on a circle, said circle being concentric with said cross-sectional shape.

27. The system of claim 26 wherein said at least one distributor is centered on said circle.

28. The system of claim 26 further comprising a second dispersion head, said second dispersion head lying on said circle.

29. The system of claim 28 wherein a center of said first dispersion head is spaced 180 degrees apart on said circle from a center of said second dispersion head.

30. The system of claim 25 wherein said first dispersion head comprises an infrared transparent material.

31. The system of claim 30 wherein said infrared transparent material comprises quartz.

32. The system of claim 25 wherein said first dispersion head further comprises a first dispersion head coupling.

33. The system of claim 32 wherein said first dispersion head further comprises a channel section, said channel section comprising said at least one distributor.

34. The system of claim 33 wherein said first dispersion head coupling comprises a channel coupled to a channel of said channel section, said channel of said channel section being coupled to said at least one distributor.

35. The system of claim 34 wherein said at least one distributor comprises a first distributor and a second distributor, said second distributor having a greater cross-sectional area than said first distributor.

36. The system of claim 35 wherein said first distributor is adjacent a first end of said channel section and said second distributor is adjacent a second end of said channel section opposite said first end.

37. The system of claim 36 wherein said first dispersion head coupling is adjacent said first end.

38. The system of claim 37 wherein said first dispersion head coupling is a mount for supporting said first dispersion head in said barrel reactor.

39. The system of claim 38 wherein said first dispersion head coupling is located at a first end of a channel section of said first dispersion head, said first dispersion head further comprising a support at a second end of said channel section opposite said first end.

40. The system of claim 25 wherein said at least one distributor comprises a first distributor, said first distributor comprising an aperture.

41. The system of claim 40 wherein said aperture has a first cylindrical portion and a second flared portion.

* * * * *